United States Patent
Tsai et al.

(10) Patent No.: US 8,963,761 B2
(45) Date of Patent: Feb. 24, 2015

(54) PREDICTIVE SUCCESSIVE APPROXIMATION REGISTER ANALOG-TO-DIGITAL CONVERSION DEVICE AND METHOD

(71) Applicant: Realtek Semiconductor Corp., HsinChu (TW)

(72) Inventors: Jen-Huan Tsai, HsinChu (TW); Po-Chiun Huang, HsinChu (TW); Shih-Hsiun Huang, HsinChu (TW)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 13/954,631

(22) Filed: Jul. 30, 2013

(65) Prior Publication Data

US 2014/0035771 A1 Feb. 6, 2014

(30) Foreign Application Priority Data

Aug. 3, 2012 (TW) ............... 101128087 A

(51) Int. Cl.
*H03M 1/34* (2006.01)
*H03M 1/12* (2006.01)
*H03M 1/46* (2006.01)

(52) U.S. Cl.
CPC ............. *H03M 1/12* (2013.01); *H03M 1/466* (2013.01)
USPC ........... 341/163; 345/173; 345/175; 345/176; 345/178; 341/130; 341/135; 341/140; 341/145; 341/160

(58) Field of Classification Search
CPC ......... G03F 3/044; G03F 3/0416; G03F 3/05; H03M 1/12
USPC ........ 341/130–165; 345/173–178; 178/18.01, 178/18.06
See application file for complete search history.

(56) References Cited

U.S. PATENT DOCUMENTS

| 6,738,048 | B1 * | 5/2004 | Rundel ........................ 345/173 |
| 8,035,622 | B2 * | 10/2011 | Hotelling et al. ............. 345/173 |
| 8,674,960 | B2 * | 3/2014 | Lin et al. ....................... 345/174 |

(Continued)

FOREIGN PATENT DOCUMENTS

TW I328356 8/2010

OTHER PUBLICATIONS

Hegong Wei, Chi-Hang Chan, U-Fat Chio, Sai-Weng Sin, Seng-Pan U, Rui Martins, and Franco Maloberti, "A 0.024mm2 8b 400MS/s SAR ADC with 2b/Cycle and Resistive DAC in 65nm CMOS", published in: 2011 IEEE International Solid-State Circuits Conference (Journal), Feb. 22, 2011, pp. 188-190, vol. 54, IEEE, Laura C. Fujino, New Brunswick, USA.

(Continued)

*Primary Examiner* — Lam T Mai
(74) *Attorney, Agent, or Firm* — Muncy, Geissler, Olds & Lowe, P.C.

(57) ABSTRACT

A predictive successive approximation register analog-to-digital conversion device and method are provided. A difference between two input signals of a comparator is detected according to a threshold less than or equal to ½ of a voltage increment represented by one least significant bit (LSB). When a difference between a first analog signal and a second analog signal is less than a threshold, a detection circuit enables a bit in a digital signal corresponding to a comparison cycle to which the difference belongs to be forcedly decided to be a first value and predicts values of the remaining bits.

26 Claims, 13 Drawing Sheets

(56) References Cited

U.S. PATENT DOCUMENTS

2007/0132741 A1* 6/2007 Chiu et al. ............... 345/173
2010/0079327 A1* 4/2010 Berens et al. ............ 341/158
2010/0309035 A1* 12/2010 Yue et al. ................ 341/141
2011/0050634 A1* 3/2011 Lin et al. ................. 345/174

OTHER PUBLICATIONS

Yuan-Ching Lien, "A 4.5-mW 8-b 750-MS/s 2-b/Step Asynchronous Subranged SAR ADC in 28-nm CMOS Technology", published in: 2012 Symposiun on VLSI Circuits Digest of Technical Papers (Journal), 2012, pp. 88-89, Widerkehr and Associates, IEEE, New Brunswick, USA.

Wenbo Liu, Pinhli Huang, and Yun Chiu, "A 12-bit, 45-MS/s, 3-mW Redundant Successive-Approximation-Register Analog-to-Digital Converter With Digital Calibration", published in: IEEE Journal of Solid-State Circuits (Journal), Nov. 2011, pp. 2661-2672, vol. 46, No. 11, IEEE, New Brunswick, USA.

Chun-Cheng Liu, Soon-Jyh Chang, Guan-Ying Huang, Ying-Zu Lin, Chung-Ming Huang, Chih-Hao Huang, Linkai Bu, and Chih-Chung Tsai, "A 10b 100MS/s 1.13mW SAR ADC with Binary-Scaled Error Compensation", published in: 2010 IEEE International Solid-State Circuits Conference (Journal), Feb. 10, 2010, pp. 386-387, vol. 53, IEEE, Laura C. Fujino, New Brunswick, USA.

Sang-Hyun Cho, Chang-Kyo Lee, Jong-Kee Kwon, and Seung-Tak Ryu, "A 550-µW 10-b 40-MS/s SAR ADC With Multistep Addition-Only Digital Error Correction", published in IEEE Journal of Solid-State Circuits (Journal), Aug. 2011, pp. 1881-1892, vol. 46, No. 8, IEEE, New Brunswick, USA.

Franz Kuttner, "1.2V 10b 20MSample/s Non-Binary Successive Approximation ADC in 0.13µm CMOS", published in 2002 IEEE International Solid-State Circuits Conference (Journal), Feb. 5, 2002, pp. 176-177, vol. 45, IEEE, New Brunswick, USA.

* cited by examiner

PREDICTIVE SUCCESSIVE APPROXIMATION REGISTER ANALOG-TO-DIGITAL CONVERSION DEVICE AND METHOD

CROSS-REFERENCES TO RELATED APPLICATIONS

This non-provisional application claims priority under 35 U.S.C. §119(a) on Patent Application No. 101128087 filed in Taiwan, R.O.C. on 2012 Aug. 3, the entire contents of which are hereby incorporated by reference.

BACKGROUND

1. Technical Field

The present invention relates to an analog-to-digital converter (ADC), and particularly to a predictive successive approximation register (SAR) ADC.

2. Related Art

There are multiple types of ADC architecture, for example, a flash ADC, a pipelined ADC, and a SAR ADC. These types of architecture have their own advantages. Generally, the architecture is selected according to different application requirements. The SAR ADC has the advantages of low power consumption, small area, and low cost, in comparison with other architecture.

Conventionally, the SAR ADC adopts a binary search algorithm to obtain a digital output code matching an input signal. In the process of conversion, according to each comparison result of a comparator, a digital-to-analog conversion circuit in the SAR ADC generally must add or subtract a voltage in a binary proportion, and after the last bit cycle ends, a difference between the input signal and a reference voltage is less than one least significant bit (LSB). However, in the process, it is possible that a high voltage is added to an originally small voltage difference, and then the voltage difference must be reduced gradually, resulting in a lot of unnecessary power consumption and energy waste. Additionally, this architecture requires many clock cycles (that is, bit cycles), to generate an output, which is not beneficial to high-speed operation.

Currently, there are several known technologies for increasing the speed of the SAR ADC. In one technology, more than one bit is decoded in each cycle. In this manner, three comparators are used in each clock cycle to decode two bits at a time, so for an 8-bit SAR ADC, four clock cycles rather than eight clock cycles can be used to complete conversion. In another technology, error compensation is used to tolerate a settling error, so each comparison clock cycle can be accelerated, and comparison can be performed before the voltage of the DAC is settled completely. In yet another technology, a binary SAR ADC is used to tolerate a settling error, so as to increase the speed of the SAR ADC.

SUMMARY

In an embodiment, a predictive SAR analog-to-digital conversion device includes a SAR ADC and a detection circuit. The SAR ADC includes a first comparator, a digital-to-analog converter (DAC), and a SAR control circuit.

The first comparator has a first input end, a second input end, and an output end. The first input end of the first comparator is used to receive a first analog signal and the second input end of the first comparator is used to receive a second analog signal. The DAC is connected electrically to the second input end of the first comparator. The SAR control circuit is coupled to a control end of the DAC and an output end of the first comparator.

The SAR control circuit is used to control an output of the DAC using a SAR algorithm and generate a digital signal according to a comparison result of the first comparator. When a difference between the first analog signal and the second analog signal is less than a threshold, the detection circuit enables a bit in the digital signal corresponding to a comparison cycle to which the difference belongs to be forcedly decided to be a first value. The threshold is less than or equal to half of a voltage increment represented by one LSB.

In an embodiment, a predictive SAR analog-to-digital conversion device includes a SAR ADC and a detection circuit. The SAR ADC includes an amplifier, a first comparator, a DAC, and a SAR control circuit.

The amplifier is used to amplify a first analog signal and a second analog signal by the same amplification factor. The first comparator has a first input end, a second input end, and an output end. The first input end of the first comparator is used to receive an amplified first analog signal and a second input end of the first comparator is used to receive an amplified second analog signal. The DAC is connected electrically to the second input end of the first comparator. The SAR control circuit is coupled to a control end of the DAC and an output end of the first comparator.

The SAR control circuit is used to control an output of the DAC using a SAR algorithm and generate a digital signal according to a comparison result of the first comparator. When a difference between the amplified first analog signal and the amplified second analog signal is less than a threshold amplified by an amplification factor, the detection circuit enables a bit in the digital signal corresponding to a comparison cycle to which the difference belongs to be forcedly decided to be a first value. The threshold is less than or equal to half of a voltage increment represented by one LSB.

In an embodiment, a predictive SAR analog-to-digital conversion method includes: comparing, by a comparator, a first analog signal with a second analog signal in each comparison cycle; providing the corresponding second analog signal using a SAR algorithm in each comparison cycle; generating a digital signal according to a comparison result of the comparator; detecting a difference between the first analog signal and the second analog signal according to a threshold in each comparison cycle; and when the difference is less than the threshold, forcedly deciding a bit in the digital signal corresponding to a comparison cycle to which the difference belongs to be a first value. The threshold is less than or equal to half of a voltage increment represented by one LSB.

In an embodiment, a predictive SAR analog-to-digital conversion method includes: amplifying a first analog signal and a second analog signal by the same amplification factor in each comparison cycle; comparing, by a comparator, the amplified first analog signal with the amplified second analog signal in each comparison cycle; providing the corresponding second analog signal using a SAR algorithm in each comparison cycle; generating a digital signal according to a comparison result of the comparator; detecting a difference between the first analog signal and the second analog signal according to a threshold amplified by an amplification factor in each comparison cycle; and when the difference is less than the threshold amplified by the amplification factor, forcedly deciding a bit in the digital signal corresponding to a comparison cycle to which the difference belongs to be a first value. The threshold is less than or equal to half of a voltage increment represented by one LSB.

To summarize, the predictive SAR analog-to-digital conversion device and method according to the present invention are applied to perform SAR analog-to-digital conversion, so that the speed of the conventional SAR ADC is increased, without adding extra comparison cycles (that is, bit cycles), or correcting offset before third comparators.

BRIEF DESCRIPTION OF THE DRAWINGS

The disclosure will become more fully understood from the detailed description given herein below for illustration only, and thus not limitative of the present invention, wherein.

DETAILED DESCRIPTION

In a predictive SAR analog-to-digital conversion device and method according to the present invention, a prediction function is added in a SAR search process. If a part of the conditions is satisfied, a value of a bit in a comparison cycle is forcedly decided. Additionally, values of the remaining bits are directly predicted, thereby reducing the time for decoding the remaining bits in the comparison cycle.

Figure 1:
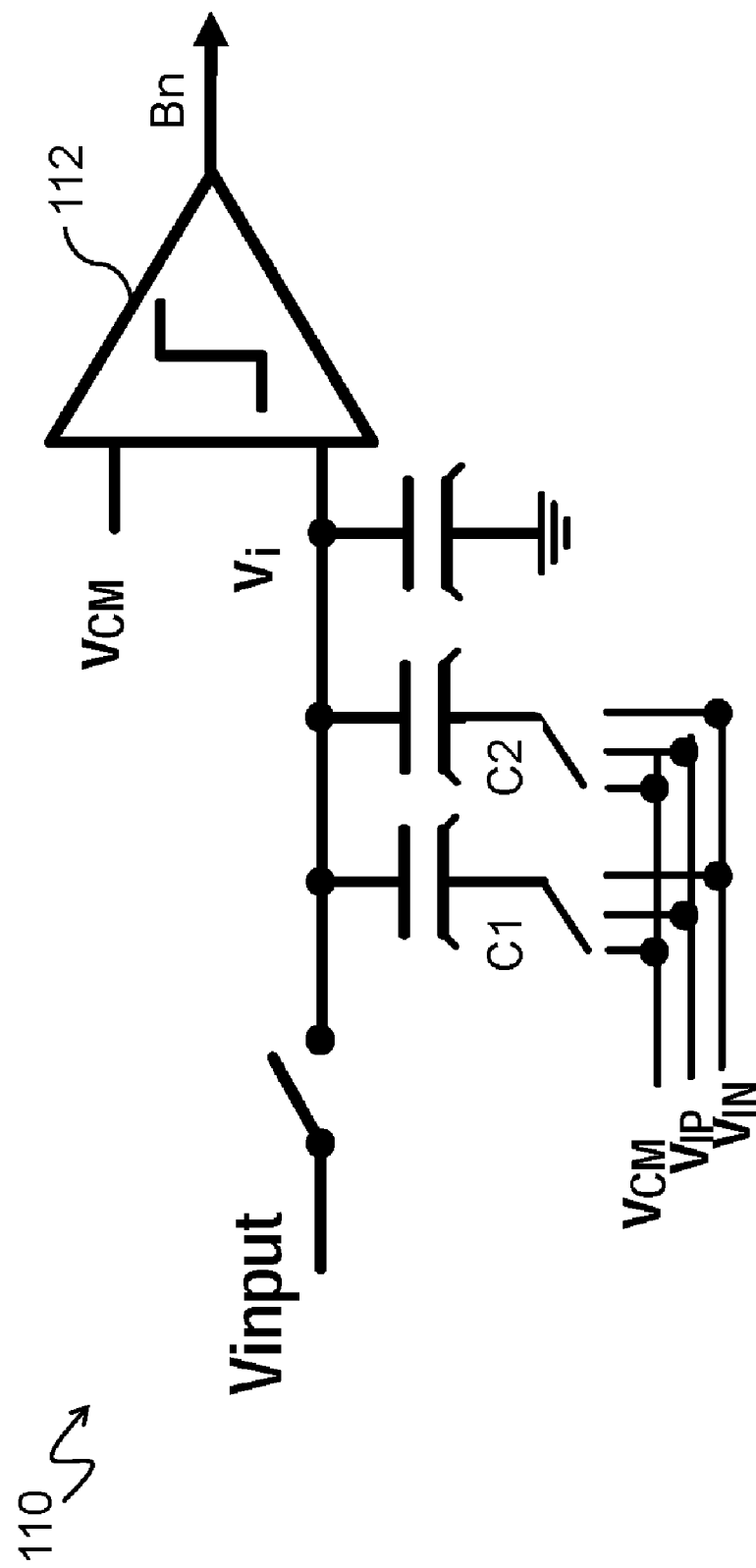
FIG. 1 is a schematic view of a SAR ADC in an embodiment of a predictive SAR analog-to-digital conversion device according to the present invention.

Please refer to FIG. 1, in which a 3-bit SAR ADC 110 with a single-ended input is taken as an example, where $V_{CM}$ is an input common mode voltage, Vi is an input voltage, $V_{IP}$ is a positive reference voltage, $V_{IN}$ is a negative reference voltage, C1 and C2 capacitance to be switched by in a DAC of the SAR ADC 110 in a search process.

Figure 2:
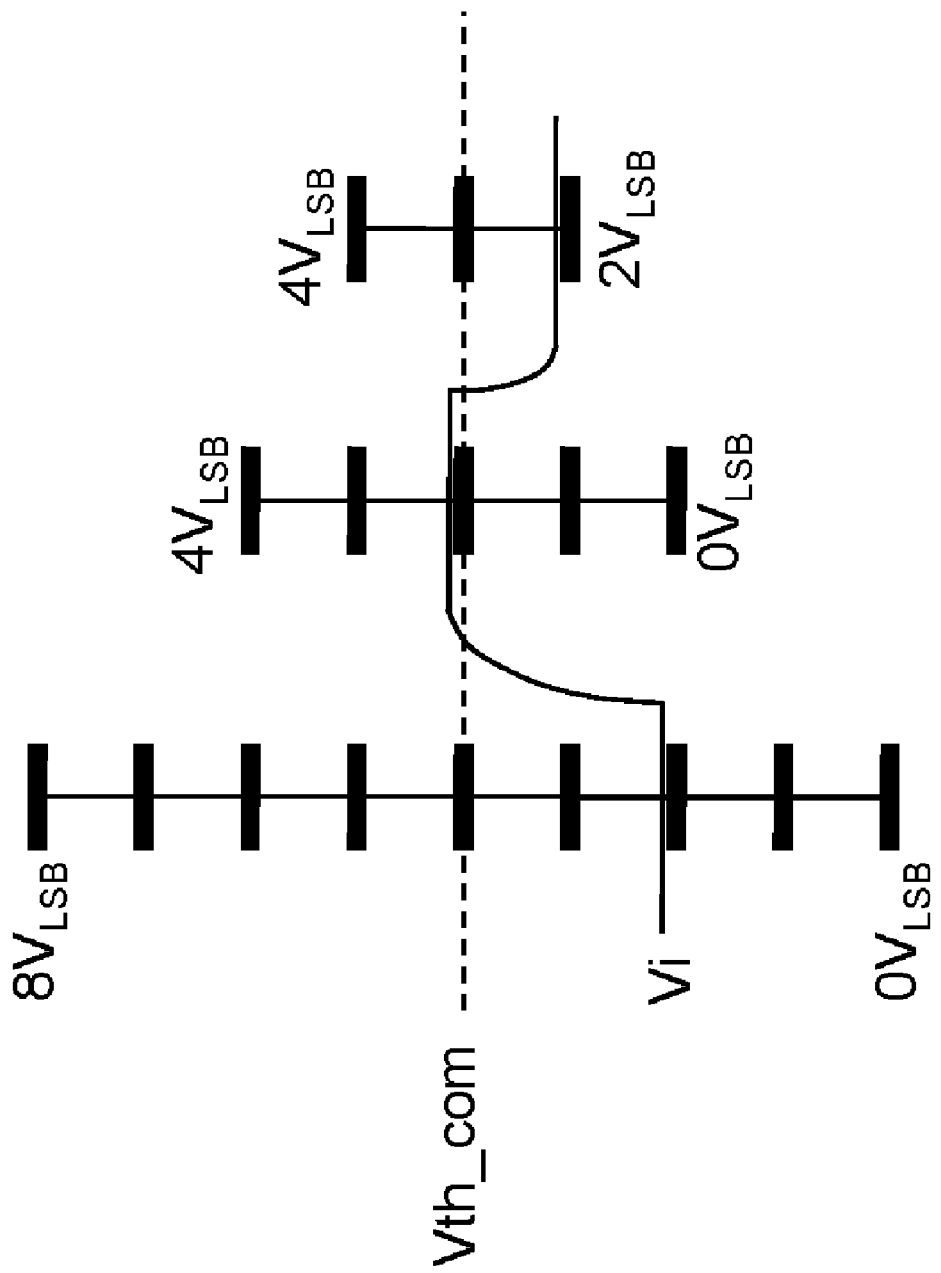
FIG. 2 is a schematic view of an operation of a first embodiment of the SAR ADC in FIG. 1.

Please refer to FIG. 2, in which conversion of the input voltage Vi is taken as an example. In the search process of the SAR ADC 110, eight intervals at the most left side represents eight quantification steps of the 3-bit SAR ADC, and the dotted line in the middle represents a comparison level Vth_cmp for a comparator 112 to judge whether a bit is logic 1 or logic 0. When the input voltage Vi is lower than the comparison level Vth_cmp of the comparator 112, a bit Bn output by the comparator 112 is 0; on the contrary, when the input voltage Vi is higher than the comparison level Vth_cmp, the output bit Bn is 1, where n is 1, 2 or 3. That is to say, n a positive integer corresponding to the number of bits of the SAR ADC 110. The waveform represented by a solid line in FIG. 2 is a transient waveform of the input voltage Vi in the search process of the SAR ADC 110, and $V_{LSB}$ is a voltage increment represented by one LSB.

The input voltage Vi is normally converted by the SAR ADC, to obtain a digital output signal [B1,B2,B3]=[0,1,0], where B1 is a most significant bit (MSB) and B3 is an LSB. In the predictive SAR analog-to-digital conversion device and method according to the present invention, in a second comparison cycle, it is found that the input signal Vi compared by the comparator is very close to the comparison level Vth_cmp of the comparator 112. A bit (B2) output this time (at the second time), is forcedly set to be logic 1, that is, P2=1, and the remaining bits (B3) are all predicted to be logic 0, that is, P3=0, so the generated digital output signal is [B1,P2,P3]= [0,1,0]. In other words, if it is found through the input or output of the comparator 112 that the input of the comparator 112 is very close to the comparison level Vth_cmp, which means that a difference between the input of the comparator 112 and the comparison level Vth_cmp is less than ½ of the magnitude of the LSB quantification step, the logic value of the output bit (P(n=i)) may be forcedly set and the remaining bits (P(n=i+1) to P(n=N)) may be predicted, where N is the LSB. Consequently, conversion of the remaining bits may be omitted without reducing the conversion accuracy. i is a positive integer less than or equal to the MSB. Pn refers to output bits that are forcedly decided or predicted, rather than the output bits (Bn) of the comparator 112.

Figure 3:
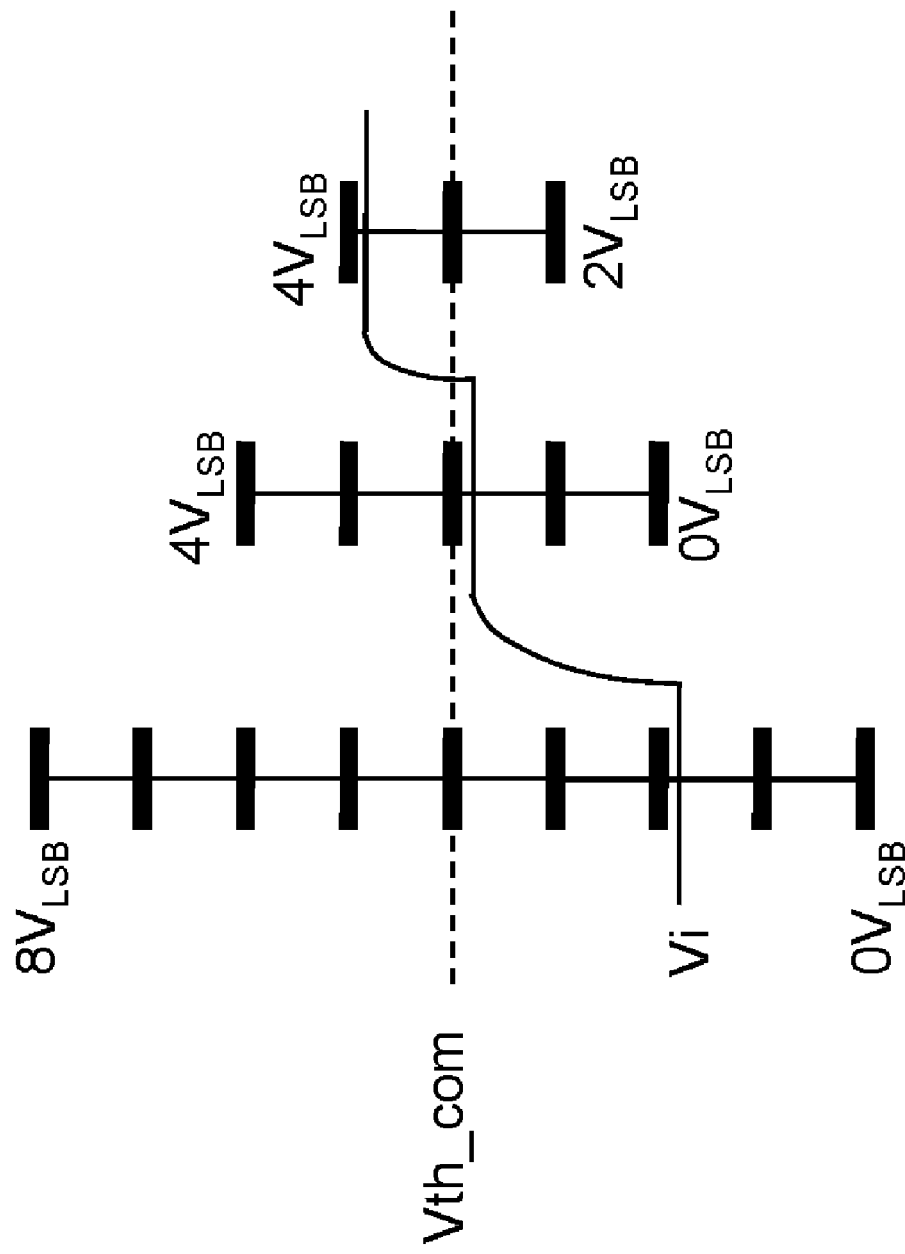
FIG. 3 is a schematic view of an operation of a second embodiment of the SAR ADC in FIG. 1.

FIG. 3 shows another possible situation of the transient waveform of the input voltage Vi in the search process of the SAR ADC 110. Please refer to FIG. 3, in which in this situation, the input voltage Vi is normally converted by the SAR ADC, to generate a digital output signal [B1,B2,B3]=[0,0,1]. In the same way, in the predictive SAR analog-to-digital conversion device and method according to the present invention, in a second comparison cycle, the input signal Vi of the comparator 112 is very close to the comparison level Vth_cmp of the comparator 112. Therefore, although the output of the second output bit (B2) should be 0 based on the comparison result, a second output bit (B2) is forcedly set to 1, that is, P2=1, the remaining bits (B3) are all predicted to be 0, that is, P3=0, and the subsequent comparison cycles are interrupted. In this case, the obtained digital output signal is [B1, P2,P3]=[0,1,0]. Although a difference of an LSB exists between the obtained digital output signal ([B1,P2,P3]=[0,1, 0]) that is forcedly decided and predicted and the output signal ([B1,B2,B3]=[0,0,1]) obtained through normal conversion, the degree of linearity of the ADC conversion is not influenced.

Figure 4:
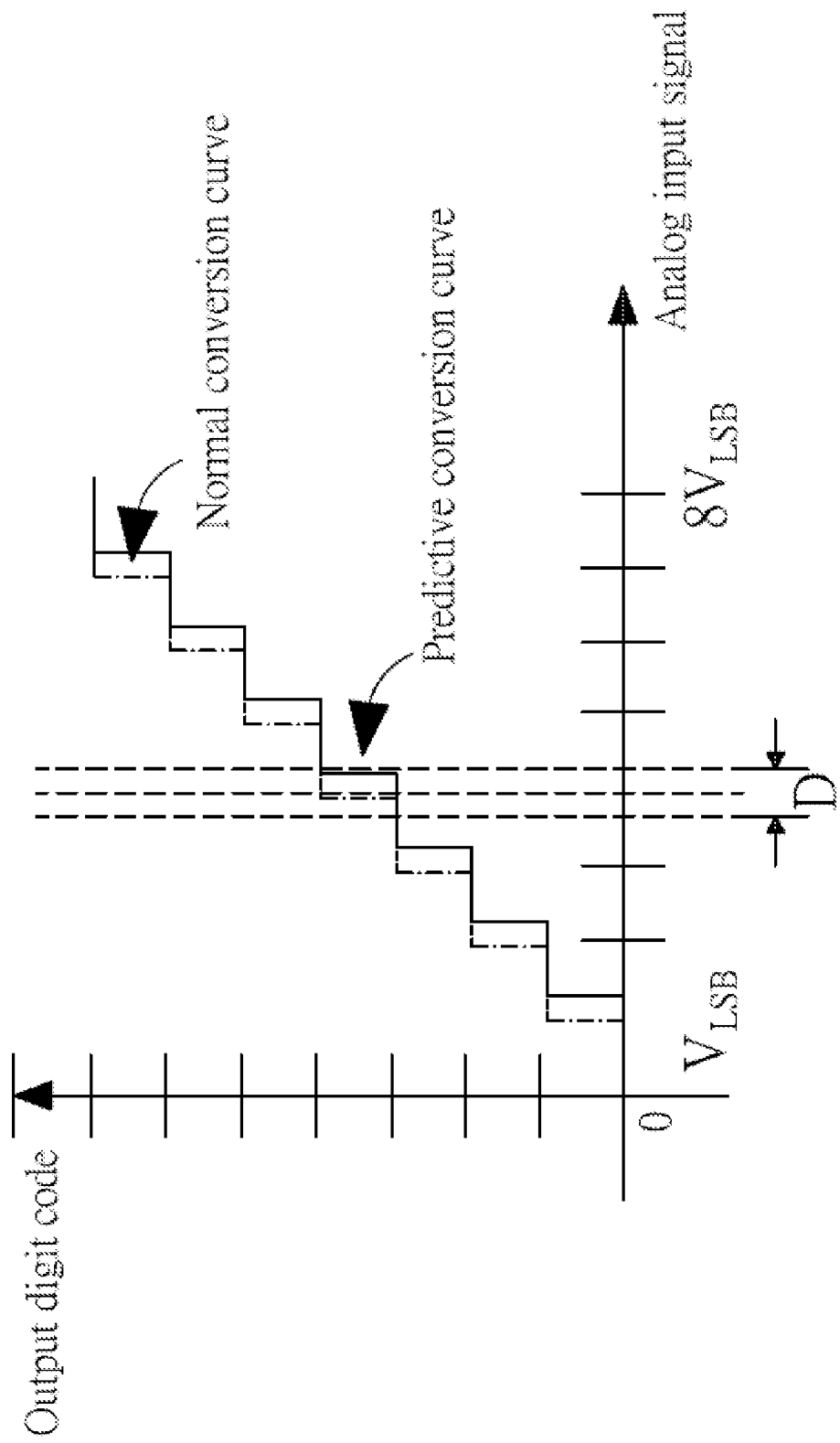
FIG. 4 is a schematic graph of a conversion curve of the SAR ADC in FIG. 1.

FIG. 4 shows a conversion curve of the 3-bit SAR ADC. Please refer to FIG. 4, in which the horizontal axis represents the magnitude of an analog input signal, and the vertical axis represents an output digit code (that is, a corresponding bit in a digital output signal). The ladder-shaped solid line at the left side is an original ideal conversion curve of the SAR ADC that does not perform prediction, and the ladder-shaped solid line at the right side is an ideal conversion curve of the predictive SAR ADC according to the present invention. It is assumed that the standard for judging whether the input voltage of the comparator 112 is very close to the comparison level is consistent in each comparison cycle and is less than half of the voltage increment $V_{LSB}$ represented by one LSB (for example, less than half of a width D of a prediction window). That is, the difference between the input voltage and the comparison level is less than half of the voltage increment $V_{LSB}$ represented by one LSB. A conversion curve obtained through the operation of the predictive SAR ADC is merely a translated curve, where an equivalent size of the translation is greater than or equal to the size of the predictive window.

The direction of the translation depends on whether the output bit set forcedly is 0 or 1. For the SAR ADC using the binary search algorithm, if the output bit is forcedly set to be 1, the remaining bits are predicted to be 0; otherwise, if the bit is forcedly set to be 0, the remaining bits are predicted to be 1. Therefore, the conversion of the SAR ADC has no loss in the degree of linearity. In the predictive SAR analog-to-digital conversion device and method according to the present invention, for the SAR ADC using the binary search algorithm, preferably, the bit is forced decided to be 1, and the remaining bits are predicted to be 0. In this way, hardware for implementation is saved.

Figure 5A:
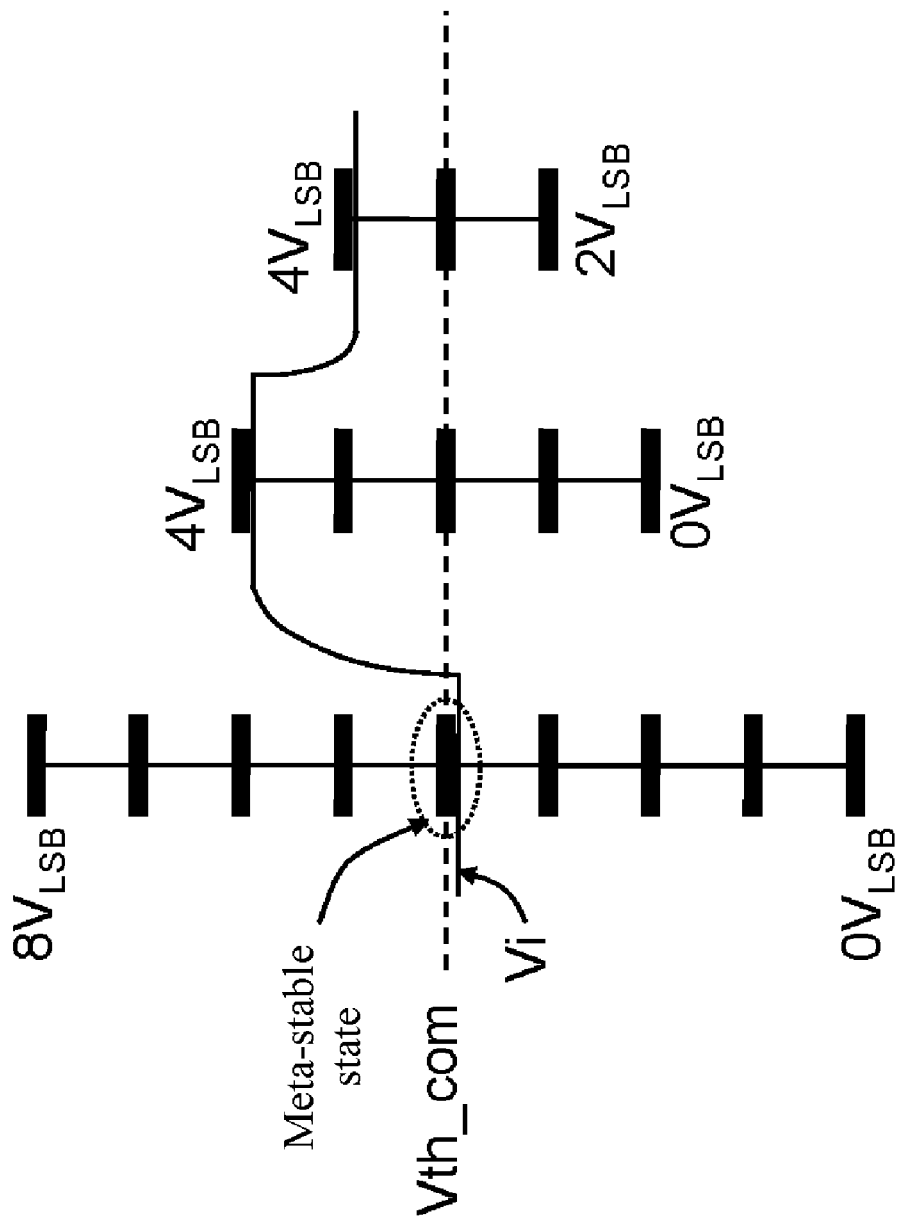
FIG. 5A is a schematic view of an operation of a third embodiment of the SAR ADC in FIG. 1.
Figure 5B:
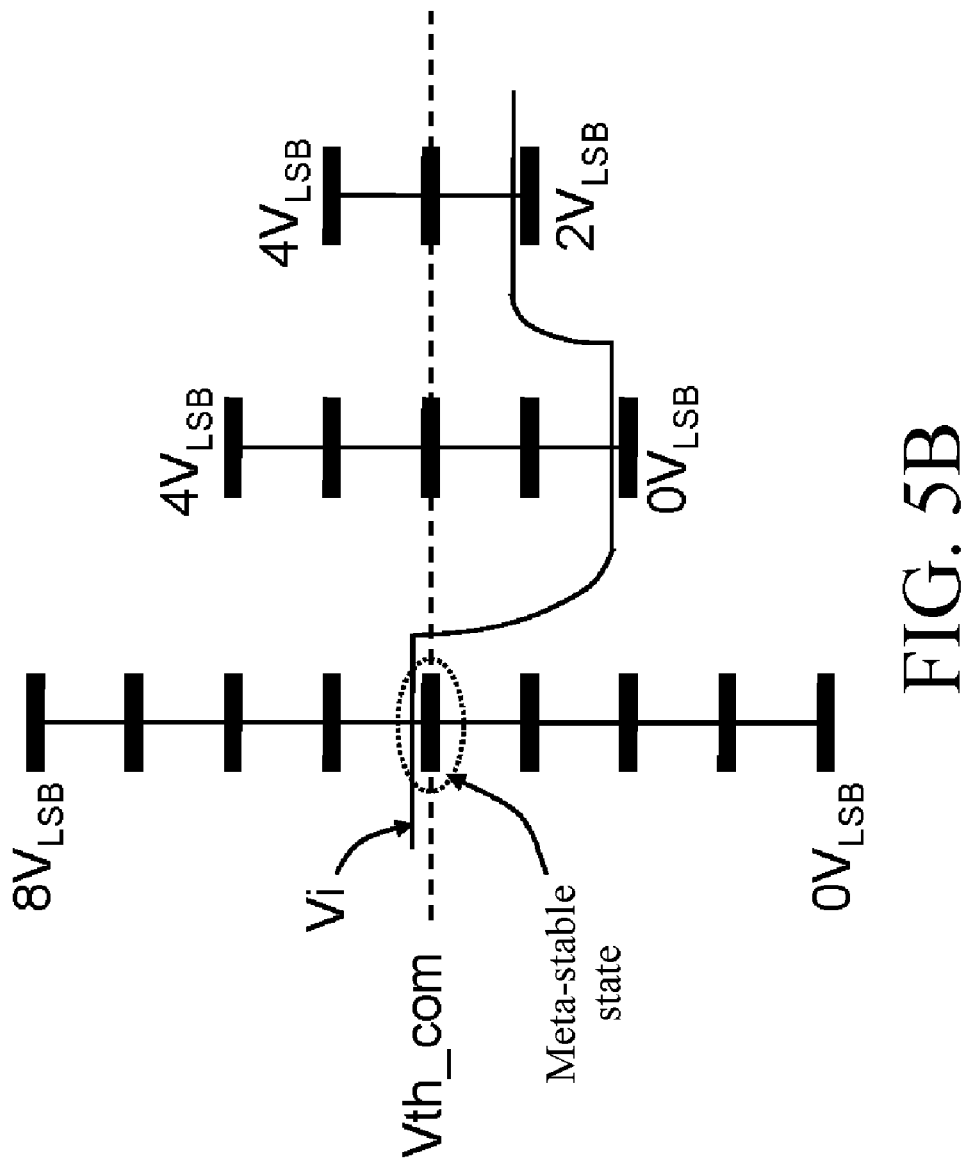
FIG. 5B is a schematic view of an operation of a fourth embodiment of the SAR ADC in FIG. 1.

FIG. 5A and FIG. 5B show yet another possible situation of the transient waveform of the input voltage Vi in the search process of the SAR ADC 110. Please refer to FIG. 5A and FIG. 5B, in which in the situation that two input signals (i.e. the input signal Vi and the comparison level Vth_cmp) are very close to each other in the first bit of the comparison cycle, in the predictive SAR analog-to-digital conversion device and method according to the present invention, all output codes are a digital output signal ([P1,P2,P3]=[1,0,0]) that is forcedly decided or predicted, but the degree of linearity of the conversion is not influenced.

Figure 6:
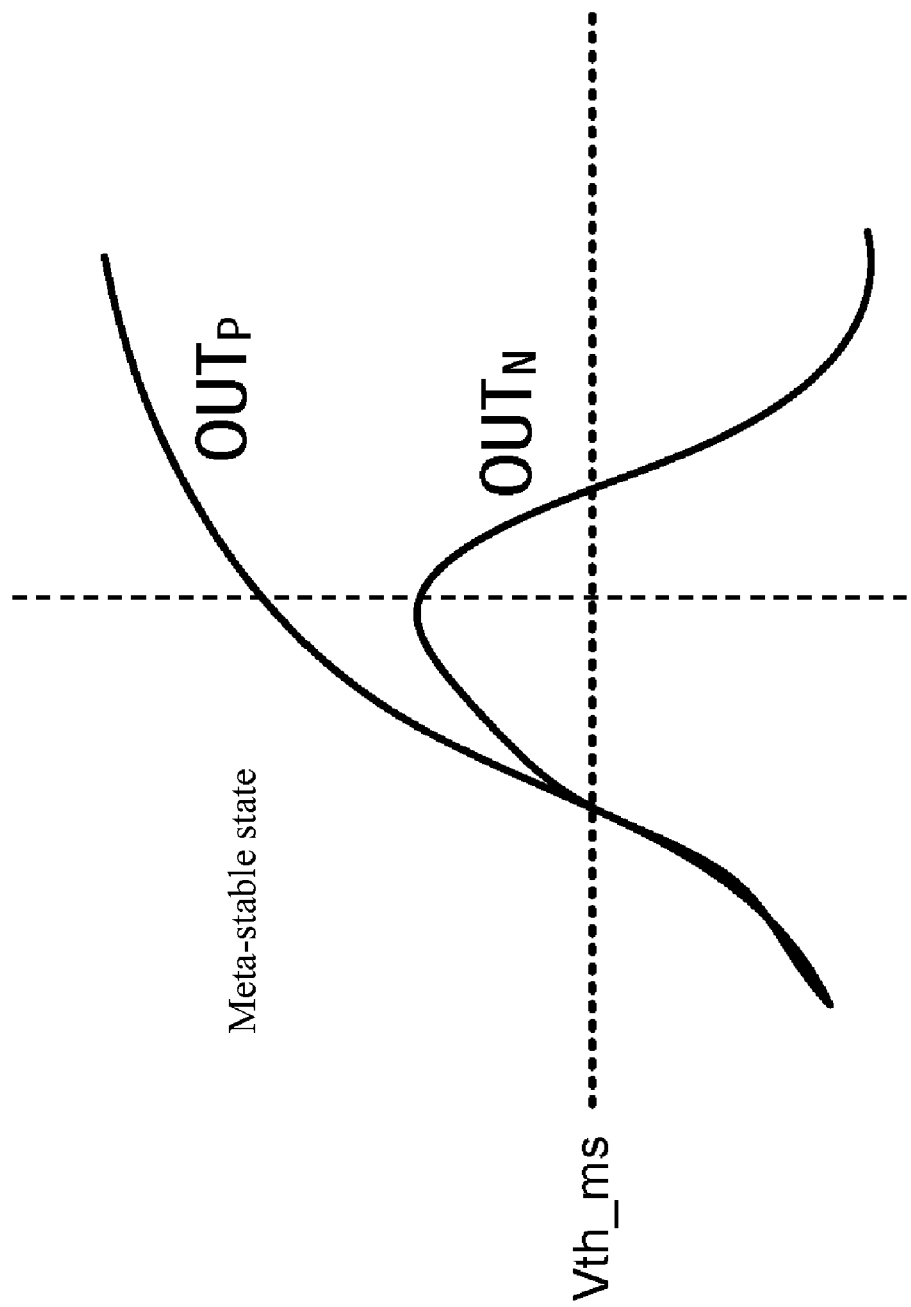
FIG. 6 is a schematic view of an embodiment of an output of a comparator in FIG. 1.

In an embodiment, the characteristics of the comparator 112 are used to perform SAR prediction. If the two input signals of the comparator 112 are very close to each other, the forced decision and prediction behavior described above is implemented, so as to end the conversion operation of the SAR ADC as soon as possible. Whether the input signals of the comparator 112 are very close to each other can be detected through double-ended output behavior of the comparator 112. Please refer to FIG. 6, in which OUTp and OUTn are two outputs of the comparator 112, and Vth_ms is a discrimination level of a meta-stable state. If the two input signals of the comparator 112 are very close to each other, the two outputs OUTp and OUTn are separated from each other for a long time, to obtain complete logic 1 (represented by a high voltage level), and logic 0 (represented by a low voltage level). Before being separated, the two outputs OUTp and OUTn are in a state incapable of being separated in a period of time, which is called a meta-stable state. Therefore, if a meta-stable state can be detected, it indicates that the two input signals of the comparator 112 are very close to each other.

Figure 7:
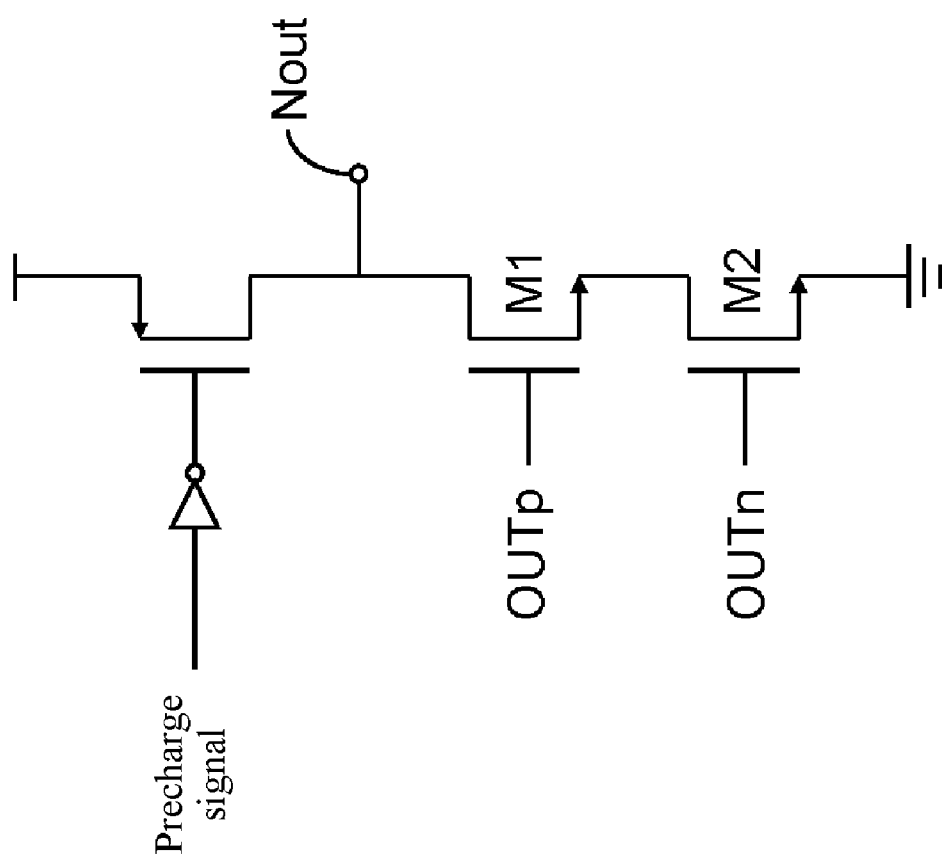
FIG. 7 is a schematic view of an embodiment of a detection circuit in a predictive SAR analog-to-digital conversion device according to the present invention.

In some embodiments, a detection circuit for detecting the meta-stable state may use an auxiliary comparator or a digital logic gate, for example, an AND gate or an NAND gate, capable of recognizing that two signals are in a high logic state at the same time. In an embodiment, two input ends of the digital logic gate receive double-ended outputs OUTp and OUTn of the comparator 112 respectively. The NAND gate is taken as an example. Please refer to FIG. 7, in which a dynamic NAND gate includes two transistors M1 and M2 concatenated between an output end Nout and the ground. Control ends of the two transistors M1 and M2 receives the double-ended outputs OUTp and OUTn of the comparator 112 respectively. When the output end Nout of the dynamic NAND gate outputs logic 0, it indicates that a meta-stable state output by the comparator 112 is detected. Similarly, the AND gate is taken as an example, when an output end Nout of the dynamic AND gate outputs logic 1, it indicates that a meta-stable state output by the comparator 112 is detected.

Figure 8:
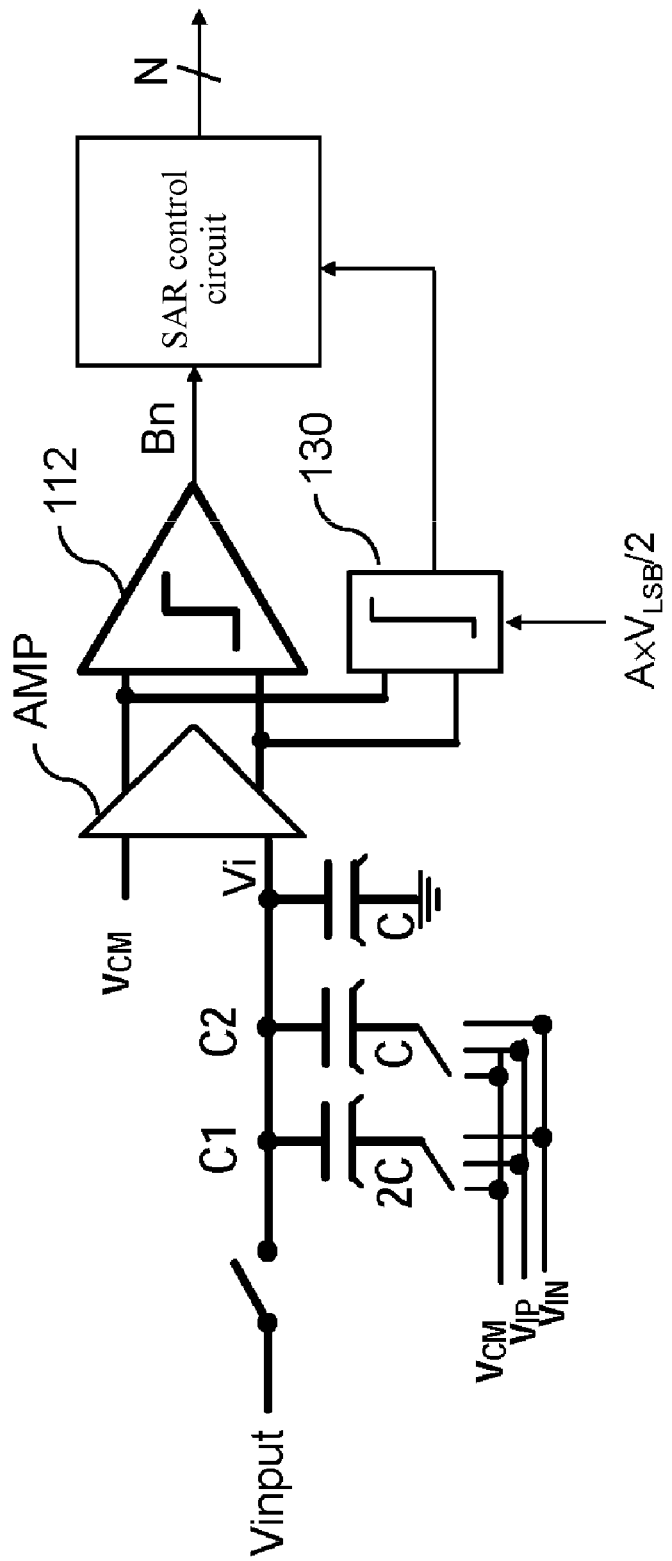
FIG. 8 is a schematic view of a predictive SAR analog-to-digital conversion device according to a first embodiment of the present invention.

In some embodiments, referring to FIG. 8, a preamplifier AMP is designed in front of the comparator 112. The preamplifier AMP is used to amplify the two input signals of the comparator 112 by the same amplification factor (A). The preamplifier AMP provides the amplified input signal to the comparator 112 for use and to the detection circuit 130 for detecting the magnitude of the input signal as an input. Through the preamplifier AMP, the magnitude of one LSB is amplified to a range that can be easily detected, and then the amplified input signals are used to judge whether the difference of the two input signals is less than a threshold. The threshold is less than or equal to half of a voltage increment represented by one LSB. Preferably, the threshold is equal to half of a voltage increment represented by one LSB. In FIG. 8, N represents the number of bits and n is an integer not greater than N. Additionally, C and 2C represent capacitance values of corresponding capacitors.

Figure 9:
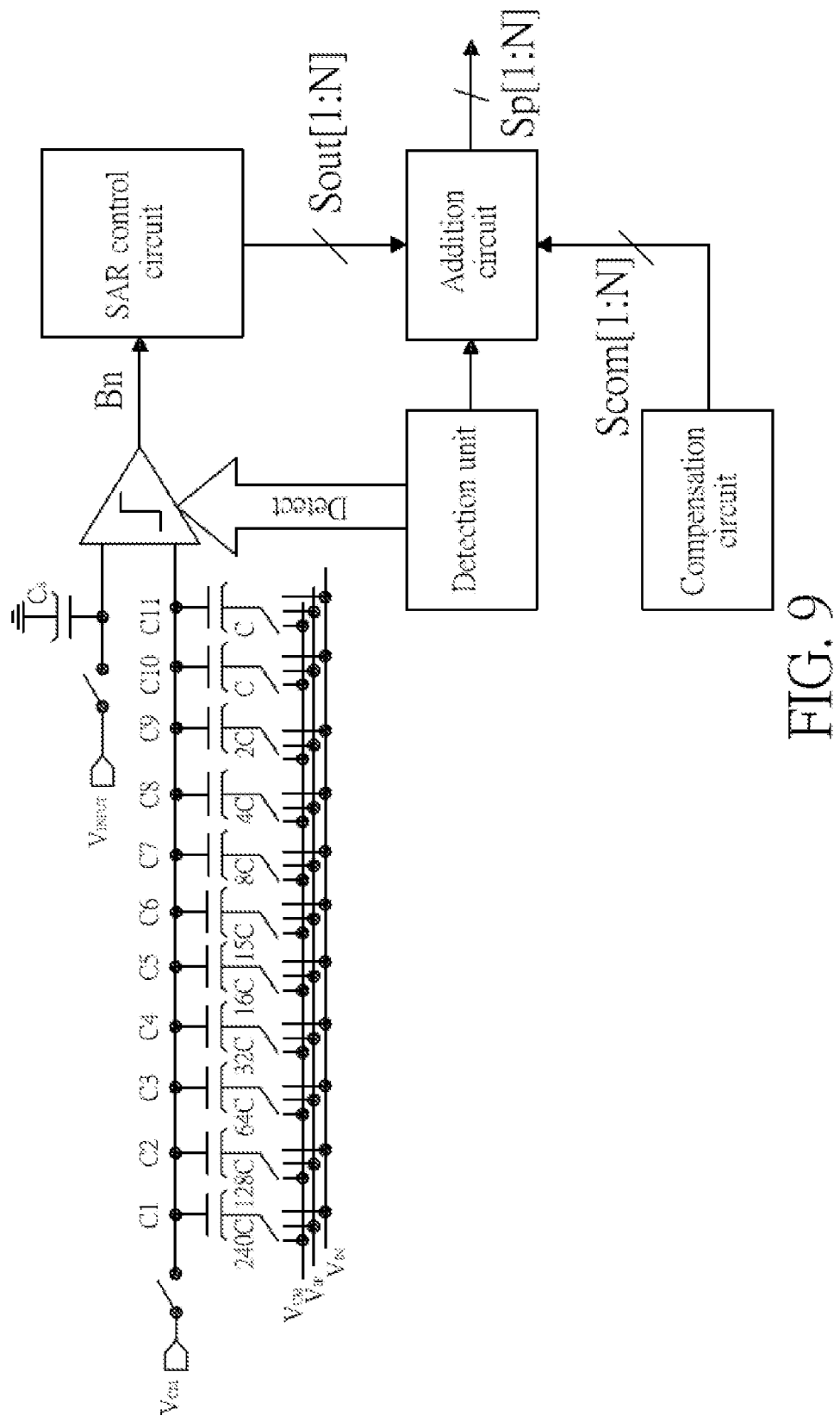
FIG. 9 is a schematic view of a predictive SAR analog-to-digital conversion device according to a second embodiment of the present invention.

Furthermore, for the SAR ADC adopting a settling error correction technology, the behavior for forcedly deciding a value and the behavior for predicting a value varies with the redundant cycles increased in the correction technology, but a lookup table may be used to obtain a forcedly decided and predicted value for the conversion having no loss in the degree of linearity. Please refer to FIG. 9, in which a 10-bit SAR ADC 110 is taken as an example. The allocation of capacitors C1 to C11 in the DAC enables the SAR ADC 110 to have the capability of tolerating a settling error, but in a common calculation process, the SAR ADC 110 needs 12 comparison cycles. In the predictive SAR analog-to-digital conversion device and method according to the present invention, bits corresponding to a comparison cycle in which the difference is less than the threshold and bits corresponding to the remaining comparison cycles are forcedly decided to be 0. Through the correction circuit for tolerating the settling error, an original 10-bit digital signal Sout[1:N] is first obtained, and then a compensation signal Scom[1:N] corresponding to the comparison cycle in which the difference is less than the threshold is obtained using the lookup table in Table 1. Values of the compensation signal Scom[1:N] in Table 1 are an MSB to an LSB from left to right. The compensation signal Scom [1:N] is added to the original digital signal Sout[1:N], to obtain a digital output signal Sp[1:N] equal to that obtained through the foregoing forced decision and prediction behavior, without loss in the degree of linearity. Compensation signals corresponding to all the comparison cycles are recorded in the lookup table. 240C, 128C, 64C, 32C, 16C, 15C, 8C, 4C, 2C and C represent the capacitance values of corresponding capacitors C1 to C11.

TABLE 1

| Comparison Cycle | Compensation Signal (Scom [1:N]) |
|---|---|
| 1 | 1,000,000,000 |
| 2 | 0,100010000 |
| 3 | 0010010000 |
| 4 | 0001010000 |
| 5 | 0000110000 |
| 6 | 0000100000 |
| 7 | 0000010001 |
| 8 | 0000001001 |
| 9 | 0000000101 |
| 10 | 0000000011 |
| 11 | 0000000010 |
| 12 | 0000000001 |

Figure 10:
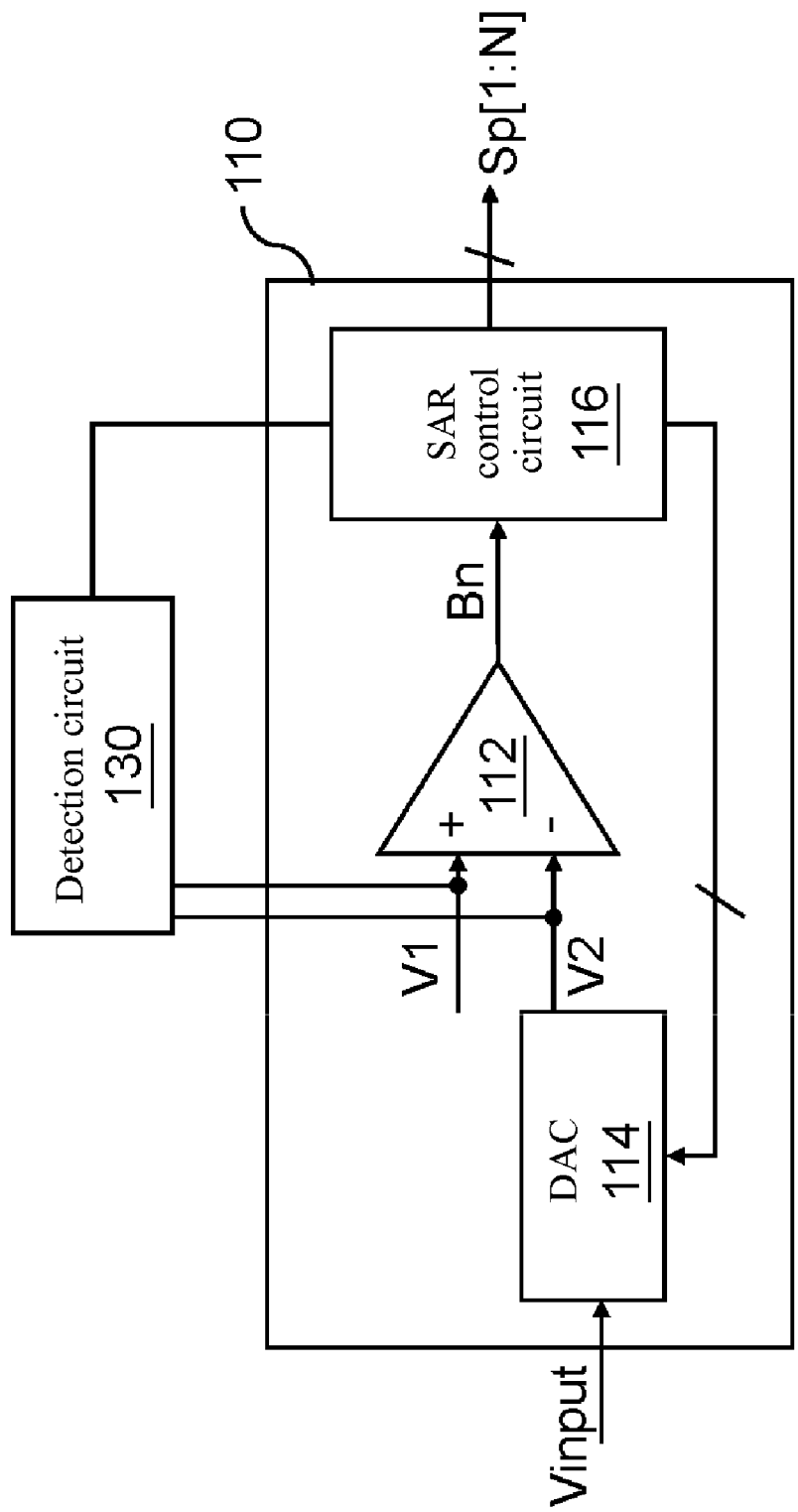
FIG. 10 is a schematic view of a predictive SAR analog-to-digital conversion device according to a third embodiment of the present invention.
Figure 11:
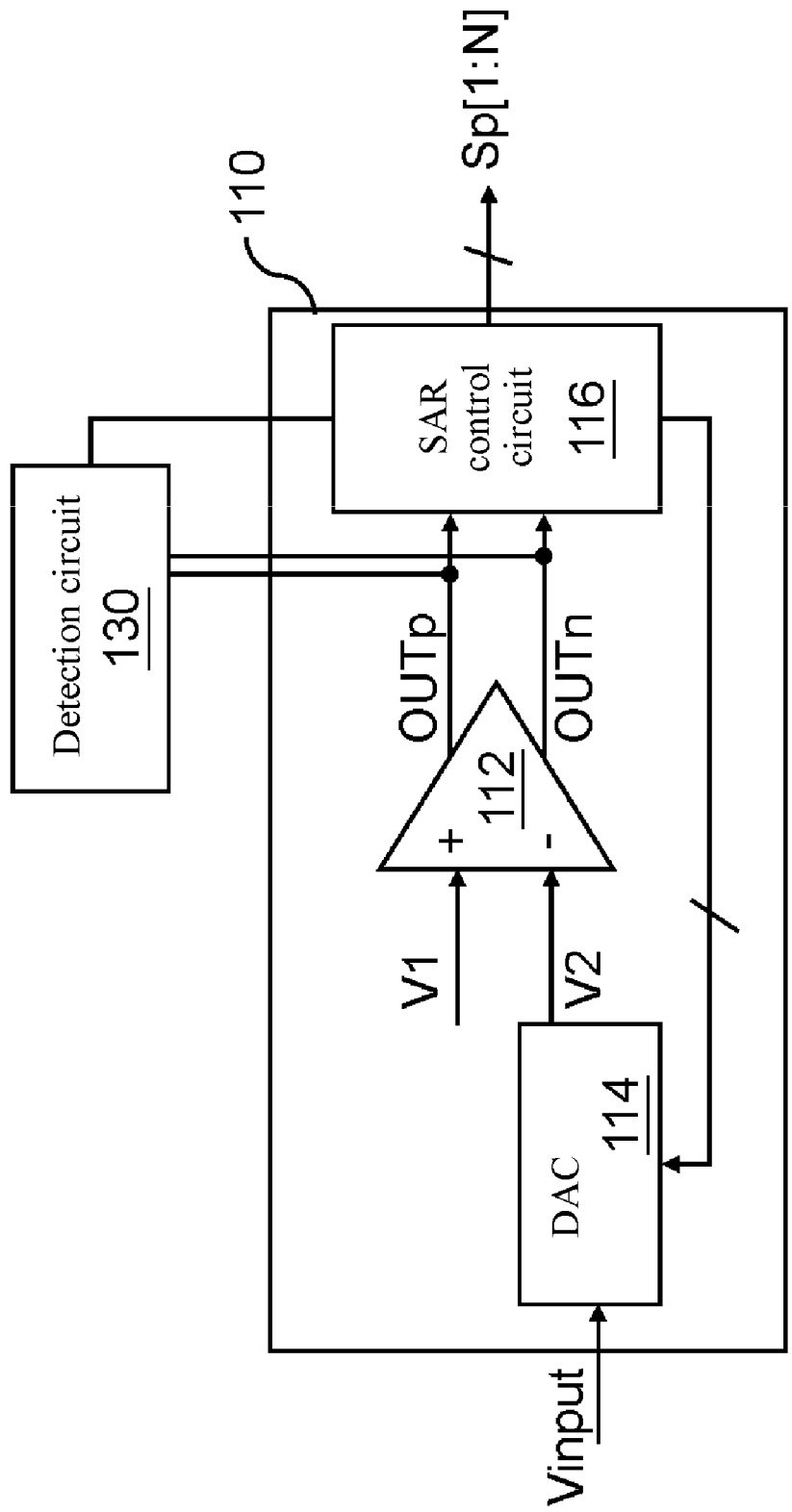
FIG. 11 is a schematic view of a predictive SAR analog-to-digital conversion device according to a fourth embodiment of the present invention.

In an embodiment, referring to FIG. 10 and FIG. 11, a predictive SAR analog-to-digital conversion device includes a SAR ADC 110 and a detection circuit 130. The SAR ADC 110 includes a first comparator 112, a DAC 114, and a SAR control circuit 116.

A first input end of the first comparator 112 receives a first analog signal V1. A second input end of the first comparator 112 is connected electrically to an output end of the DAC 114 and receives an output (that is, a second analog signal V2), of the DAC 114. The SAR control circuit 116 is coupled to a control end of the DAC 114 and an output end of the first comparator 112.

The SAR control circuit 114 controls the output of the DAC 114 using a SAR algorithm. In an embodiment, the DAC 114 outputs the second analog signal V2 based on an analog input signal Vinput, a common mode voltage $V_{CM}$, a positive reference voltage $V_{IP}$, and a negative reference voltage $V_{IN}$ under the control of the SAR control circuit 116. Herein, the first analog signal V1 may be a common mode voltage ($V_{CM}$) and the second analog signal V2 may be an input voltage (Vi). In an embodiment, the DAC 114 includes a capacitor array having a plurality of bits from an MSB to an LSB and a switch array coupled to the capacitor array. The SAR control circuit 116 adjusts voltage levels of a predetermined number of bits one by one by controlling the switch array, so that the DAC 114 provides the second analog signal V2.

Additionally, the SAR control circuit 116 generates a digital output signal Sp[1:N] according to a comparison result of the first comparator 112. Herein, Sp[N] is an LSB and Sp[1] is an MSB. When the detection circuit 130 detects that a difference between the first analog signal V1 and the second analog signal V2 is less than a threshold, the detection circuit 130 enables a bit Sp[i] in the digital output signal Sp[1:N] corresponding to a comparison cycle to which the difference belongs to be forcedly decided to be a first value. The threshold is less than or equal to half of a voltage increment $V_{LSB}$ represented by one LSB. Preferably, the threshold is equal to half of a voltage increment $V_{LSB}$ represented by one LSB.

An output of the first comparator 112 may be a single-ended signal or a double-ended signal. The SAR algorithm may be a binary search algorithm.

In some embodiments, when the difference is less than the threshold, the detection circuit 130 enables bits in the digital output signal Sp[1:N] lower than the bit Sp[i+1:N] corresponding to the comparison cycle (i) to which the difference belongs to be forcedly decided to be a second value. The first value and the second value are opposite numbers, for example, 0 and 1.

In some embodiments, when the difference is less than the threshold, the detection circuit 130 actuates the SAR control circuit 116 to stop the subsequent comparison operation.

In some embodiments, referring to FIG. 10, the detection circuit 130 can determine whether the difference between the first analog signal V1 and the second analog signal V2 is less than the threshold by detecting the first analog signal V1 and the second analog signal V2. The threshold is less than or equal to half of a voltage increment $V_{LSB}$ represented by one LSB. Preferably, the threshold is equal to half of a voltage increment $V_{LSB}$ represented by one LSB.

Herein, the detection circuit 130 may include a second comparator. A first differential input end of the second comparator is connected electrically to the first input end and the second input end of the first comparator 112 respectively. A second differential input end of the second comparator receives the threshold. If a situation that the threshold is ½ of the voltage increment $V_{LSB}$ is taken as an example, the second differential input end of the second comparator receives a voltage signal with ½ voltage increment $V_{LSB}$.

In some embodiments, referring to FIG. 11, the detection circuit 130 can determine whether the difference between the first analog signal V1 and the second analog signal V2 is less than a threshold by detecting a meta-stable state of outputs OUTp and OUTn of the first comparator 112. The threshold is less than or equal to half of a voltage increment $V_{LSB}$ represented by one LSB. Preferably, the threshold is equal to half of a voltage increment $V_{LSB}$ represented by one LSB. In some embodiments, the detection circuit 130 may include a second comparator. Input ends of the second comparator receive the outputs OUTp and OUTn of the first comparator 112 respectively. In some embodiments, the detection circuit 130 may include a digital logic gate. Inputs end of the digital logic gate receive the outputs OUTp and OUTn of the first comparator 112 respectively.

Figure 12:
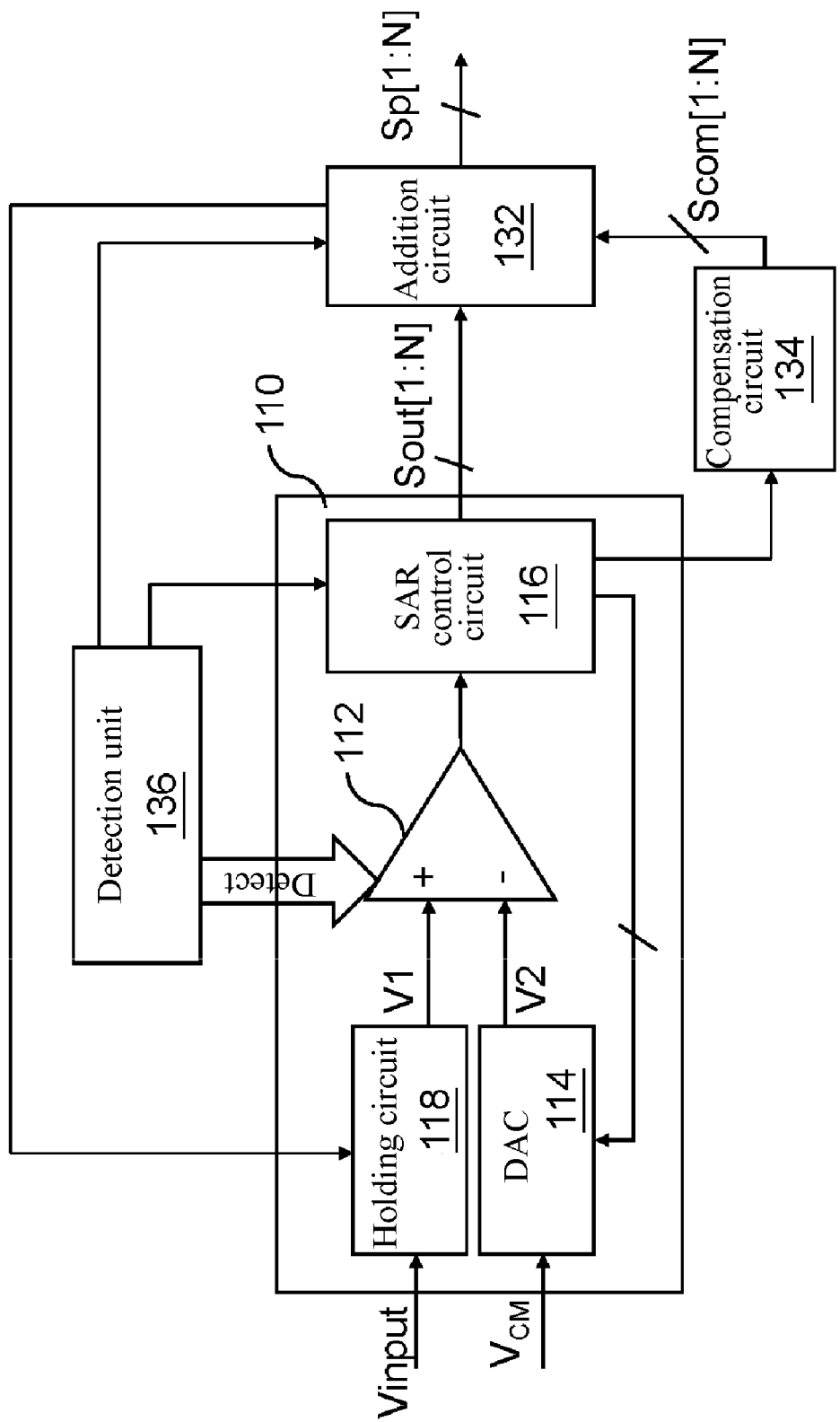
FIG. 12 is a schematic view of a predictive SAR analog-to-digital conversion device according to a fifth embodiment of the present invention.

Please refer to FIG. 12, in which the SAR ADC 110 uses a settling error correction technology. Herein, the DAC 114 outputs the second analog signal V2 based on a common mode voltage $V_{CM}$, a positive reference voltage $V_{IP}$, and a negative reference voltage $V_{IN}$ under the control of the SAR control circuit 114. Additionally, the first analog signal V1 is generated by a sampling and holding circuit 118 performing sampling and holding processing on an analog input signal Vinput under the control of the SAR control circuit 114. Herein, the first analog signal V1 may be an input voltage ($V_i$) and the second analog signal V2 may correspond to a common mode voltage ($V_{CM}$).

In this embodiment, the detection circuit 130 includes an addition circuit 132, a compensation circuit 134, and a detection unit 136.

A first input end of the addition circuit 132 is coupled to an output end of the SAR control circuit 114, to receive a digital signal Sout[1:N] output by the SAR control circuit 114. A second input end of the addition circuit 132 is coupled to an output end of the compensation circuit 134. A control end of the addition circuit 132 is coupled to an output end of the detection circuit 136.

The compensation circuit 134 outputs a corresponding compensation signal Scom[1:N] to the addition circuit 132 in each comparison cycle according to a lookup table for recording a plurality of compensation signals corresponding to a plurality of comparison cycles respectively. Herein, the compensation circuit 134 may determine a current comparison cycle through the SAR control circuit 114 and obtain a compensation signal Scom[1:N] corresponding to the current comparison cycle from the lookup table.

The detection circuit 136 can determine whether the difference between the first analog signal V1 and the second analog signal V2 is less than the threshold by detecting inputs (the first analog signal V1 and the second analog signal V2) or outputs OUTp and OUTn of the first comparator 112. The threshold is less than or equal to half of a voltage increment $V_{LSB}$ represented by one LSB. Preferably, the threshold is equal to half of a voltage increment $V_{LSB}$ represented by one LSB.

When the difference between the first analog signal V1 and the second analog signal V2 is less than the threshold, the detection unit 136 actuates the addition circuit 132 to add the received digital signal Sout[1:N] and the compensation signal Scom[1:N] to generate a digital output signal Sp[1:N]. A bit Sp[i] in the digital output signal Sp[1:N] corresponding to a comparison cycle (i) to which the difference belongs is be a first value.

In some embodiments, when the difference between the first analog signal V1 and the second analog signal V2 is less than the threshold, the detection unit 136 further actuates the SAR control circuit 116 to stop the subsequent comparison operation (that is, the subsequent comparison cycle is not executed).

In some embodiments, the input signals of the first comparator 112 may also be amplified by an amplification factor A by a preamplifier AMP and then compared. In this case, a judgment standard of the detection circuit 130 is changed from the foregoing threshold to a threshold amplified by the amplification factor A. For example, a situation that the threshold is half of a voltage increment $V_{LSB}$ represented by one LSB (that is, $V_{LSB}/2$), is taken as an example. The judgment standard is changed from $V_{LSB}/2$ to a value (that is, $A \times V_{LSB}/2$) obtained by amplifying half of the voltage increment $V_{LSB}$ by the amplification factor A.

To summarize, the predictive SAR analog-to-digital conversion device and method according to the present invention are applied to perform SAR analog-to-digital conversion, so that the speed of the conventional SAR ADC is increased, without adding extra comparison cycles (that is, bit cycles), or correcting offset before third comparators.

While the present invention has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A predictive successive approximation register (SAR) analog-to-digital conversion device, comprising:
    a SAR analog-to-digital converter (ADC), comprising:
        a first comparator, having a first input end for receiving a first analog signal, a second input end for receiving a second analog signal, and an output end;
        a digital-to-analog converter (DAC), connected electrically to the second input end of the first comparator; and
        a SAR control circuit, coupled to a control end of the DAC and the output end of the first comparator, for controlling an output of the DAC using a SAR algorithm, and generating a digital signal according to a comparison result of the first comparator; and
    a detection circuit, for when a difference between the first analog signal and the second analog signal is less than a threshold, enabling a bit of the digital signal corresponding to a comparison cycle to which the difference belongs to be forcedly decided to be a first value.

2. The predictive SAR analog-to-digital conversion device according to claim 1, wherein the threshold is less than or equal to half of a voltage increment represented by one least significant bit (LSB).

3. The predictive SAR analog-to-digital conversion device according to claim 1, wherein when the difference is less than the threshold, the detection circuit enables each bit in the digital signal lower than the bit corresponding to the comparison cycle to which the difference belongs to be forcedly decided to be a second value.

4. The predictive SAR analog-to-digital conversion device according to claim 1, wherein the detection circuit is coupled to the SAR control circuit, and when the difference is less than the threshold, the detection circuit enables the SAR control circuit to stop a subsequent comparison operation.

5. The predictive SAR analog-to-digital conversion device according to claim 1, wherein the detection circuit comprises:
    an addition circuit, having a first input end for receiving the digital signal and a second input end;
    a compensation circuit, coupled to the second input end of the addition circuit, for outputting a corresponding compensation signal to the addition circuit in each comparison cycle according to a lookup table recording a plurality of compensation signals corresponding to a plurality of comparison cycles respectively; and
    a detection unit, for actuating the addition circuit to add the digital signal and the compensation signal to generate a digital output signal when the difference is less than the threshold, wherein the bit in the digital signal corresponding to the comparison cycle to which the difference belongs is the first value.

6. The predictive SAR analog-to-digital conversion device according to claim 1, wherein the detection circuit comprises:
    a second comparator, an input end of the second comparator coupled to the output end of the first comparator, for detecting a meta-stable state of an output of the first comparator, wherein when the meta-stable state is detected, the difference is less than the threshold.

7. The predictive SAR analog-to-digital conversion device according to claim 1, wherein the detection circuit comprises:
    a second comparator, a first differential input end of the second comparator connected electrically to the first input end and the second input end of the first comparator, a second differential input end of the second comparator for receiving the threshold.

8. A predictive successive approximation register (SAR) analog-to-digital conversion device, comprising:
    a SAR analog-to-digital converter (ADC), comprising:
        an amplifier, for amplifying a first analog signal and a second analog signal by the same amplification factor,
        a first comparator, having a first input end for receiving an amplified first analog signal, a second input end for receiving an amplified second analog signal, and an output end;
        a digital-to-analog converter (DAC), connected electrically to the second input end of the first comparator; and
        a SAR control circuit, coupled to a control end of the DAC and the output end of the first comparator, for controlling an output of the DAC using a SAR algorithm, and generating a digital signal according to a comparison result of the first comparator; and
    a detection circuit, for when a difference between the amplified first analog signal and the amplified second analog signal is less than a threshold amplified by an amplification factor, enabling a bit in the digital signal corresponding to a comparison cycle to which the difference belongs to be forcedly decided to be a first value.

9. The predictive SAR analog-to-digital conversion device according to claim 8, wherein the threshold is less than or equal to half of a voltage increment represented by one least significant bit (LSB).

10. The predictive SAR analog-to-digital conversion device according to claim 8, wherein when the difference is less than the threshold amplified by the amplification factor, the detection circuit enables bits in the digital signal lower than the bit corresponding to the comparison cycle to which the difference belongs to be forcedly decided to be a second value.

11. The predictive SAR analog-to-digital conversion device according to claim 8, wherein the detection circuit comprises:
    an addition circuit, having a first input end for receiving the digital signal and a second input end;

a compensation circuit, coupled to the second input end of the addition circuit, for outputting a corresponding compensation signal to the addition circuit in each comparison cycle according to a lookup table recording a plurality of compensation signals corresponding to a plurality of comparison cycles respectively; and a detection unit, for actuating the addition circuit to add the digital signal and the compensation signal to generate a digital output signal when the difference is less than the threshold amplified by the amplification factor, wherein the bit of the digital signal corresponding to the comparison cycle to which the difference belongs is the first value.

12. The predictive SAR analog-to-digital conversion device according to claim 8, wherein the detection circuit comprises:

a second comparator, an input end of the second comparator coupled to the output end of the first comparator, for detecting a meta-stable state of an output of the first comparator, wherein when the meta-stable state is detected, the difference is less than the threshold amplified by the amplification factor.

13. The predictive SAR analog-to-digital conversion device according to claim 8, wherein the detection circuit comprises:

a second comparator, a first differential input end of the second comparator connected electrically to the first input end and the second input end of the first comparator, a second differential input end of the second comparator for receiving the threshold amplified by the amplification factor.

14. A predictive successive approximation register (SAR) analog-to-digital conversion method, comprising:

comparing a first analog signal with a second analog signal in each of a plurality of comparison cycles by a comparator;

providing the corresponding second analog signal using a SAR algorithm in each comparison cycle;

generating a digital signal according to a comparison result of the comparator;

detecting a difference between the first analog signal and the second analog signal according to a threshold in each comparison cycle; and when the difference is less than the threshold, forcedly deciding a bit in the digital signal corresponding to a comparison cycle to which the difference belongs to be a first value.

15. The predictive SAR analog-to-digital conversion method according to claim 14, wherein the threshold is less than or equal to half of a voltage increment represented by one least significant bit (LSB).

16. The predictive SAR analog-to-digital conversion method according to claim 14, wherein when the difference is less than the threshold, the method further comprises: forcedly deciding bits in the digital signal lower than the bit corresponding to the comparison cycle to which the difference belongs to be a second value.

17. The predictive SAR analog-to-digital conversion method according to claim 14, wherein the forced decision step comprises:

obtaining a compensation signal corresponding to the comparison cycle to which the difference belongs from a lookup table for recording a plurality of compensation signals corresponding to the plurality of comparison cycles, wherein a bit in the corresponding compensation signal corresponding to the comparison cycle to which the difference belongs is the first value; and adding the digital signal and the compensation signal to generate a digital output signal.

18. The predictive SAR analog-to-digital conversion method according to claim 14, wherein when the difference is less than the threshold, the method further comprises: stopping a subsequent comparison step in the comparison cycle.

19. The predictive SAR analog-to-digital conversion method according to claim 14, wherein the detection step comprises:

receiving the first analog signal, the second analog signal and half of the threshold;

calculating the difference between the first analog signal and the second analog signal; and comparing the difference with the threshold.

20. The predictive SAR analog-to-digital conversion method according to claim 14, wherein the detection step comprises:

receiving an output of the comparator;

detecting a meta-stable state of the output of the comparator; and when the meta-stable state is detected, judging that the difference is less than the threshold.

21. A predictive successive approximation register (SAR) analog-to-digital conversion method, comprising:

amplifying a first analog signal and a second analog signal by the same amplification factor in each of a plurality of comparison cycles;

comparing, by a comparator, an amplified first analog signal with an amplified second analog signal according to a threshold in each comparison cycle;

providing the corresponding second analog signal using a SAR algorithm in each comparison cycle;

generating a digital signal according to a comparison result of the comparator;

detecting a difference between the first analog signal and the second analog signal according to a threshold amplified by an amplification factor in each comparison cycle; and when the difference is less than the threshold amplified by the amplification factor, forcedly deciding a bit in the digital signal corresponding to a comparison cycle to which the difference belongs to be a first value.

22. The predictive SAR analog-to-digital conversion method according to claim 21, wherein the threshold is less than or equal to half of a voltage increment represented by one least significant bit (LSB).

23. The predictive SAR analog-to-digital conversion method according to claim 21, wherein when the difference is less than the threshold amplified by the amplification factor, the method further comprises: forcedly deciding bits in the digital signal lower than the bit corresponding to the comparison cycle to which the difference belongs to be a second value.

24. The predictive SAR analog-to-digital conversion method according to claim 21, wherein the forced decision step comprises:

obtaining a compensation signal corresponding to the comparison cycle to which the difference belongs from a lookup table for recording a plurality of compensation signals corresponding to the plurality of comparison cycles, wherein a bit in the corresponding compensation signal corresponding to the comparison cycle to which the difference belongs is the first value; and adding the digital signal and the compensation signal to generate a digital output signal.

25. The predictive SAR analog-to-digital conversion method according to claim 21, wherein the detection step comprises:
- receiving the amplified first analog signal, the amplified second analog signal and the threshold amplified by the amplification factor;
- calculating the difference between the amplified first analog signal and the amplified second analog signal; and
- comparing the difference with the threshold amplified by the amplification factor.

26. The predictive SAR analog-to-digital conversion method according to claim 21, wherein the detection step comprises:
- receiving an output of the comparator;
- detecting a meta-stable state of the output of the comparator; and
- when the meta-stable state is detected, judging that the difference is less than the threshold amplified by the amplification factor.

\* \* \* \* \*